(12) United States Patent
Rui et al.

(10) Patent No.: US 11,145,683 B2
(45) Date of Patent: Oct. 12, 2021

(54) HYBRID HIGH-K DIELECTRIC MATERIAL FILM STACKS COMPRISING ZIRCONIUM OXIDE UTILIZED IN DISPLAY DEVICES

(71) Applicant: Applied Materials, Inc., Santa Clara, CA (US)

(72) Inventors: Xiangxin Rui, Campbell, CA (US); Lai Zhao, Campbell, CA (US); Jrjyan Jerry Chen, Campbell, CA (US); Soo Young Choi, Fremont, CA (US); Yujia Zhai, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/648,167

(22) Filed: Jul. 12, 2017

(65) Prior Publication Data
US 2018/0026054 A1 Jan. 25, 2018

Related U.S. Application Data

(60) Provisional application No. 62/364,140, filed on Jul. 19, 2016.

(51) Int. Cl.
*H01L 27/12* (2006.01)
*H01L 49/02* (2006.01)
(Continued)

(52) U.S. Cl.
CPC ...... *H01L 27/1255* (2013.01); *H01L 27/1222* (2013.01); *H01L 27/1237* (2013.01);
(Continued)

(58) Field of Classification Search
CPC ............ H01L 27/1237; H01L 27/1262; H01L 27/1255; H01L 27/1248; H01L 27/1222;
(Continued)

(56) References Cited

U.S. PATENT DOCUMENTS 6,060,755 A 5/2000 Ma et al.
6,137,558 A 10/2000 Koma et al.
(Continued)

FOREIGN PATENT DOCUMENTS

CN 101452162 A 6/2009
JP 2012123351 A 6/2012
(Continued)

OTHER PUBLICATIONS

Vanderbilt et al., 2016/0141372, "Structural and dielectric properties of crystalline and amorphous ZrO2," Thin Solid Films, 486 (2005), pp. 125-128.*
(Continued)

*Primary Examiner* — Mohammad M Hoque
(74) *Attorney, Agent, or Firm* — Patterson + Sheridan LLP

(57) ABSTRACT

Embodiments of the disclosure generally provide methods of forming a hybrid film stack that may be used as a capacitor layer or a gate insulating layer with a high dielectric constant as well as film qualities for display applications. In one embodiment, a thin film transistor structure include gate, source and drain electrodes formed on a substrate, and an insulating layer formed on a substrate, wherein the insulating layer is a hybrid film stack having a dielectric layer comprising a zirconium containing material disposed on an interface layer formed above or below the gate, source and drain electrodes.

11 Claims, 10 Drawing Sheets

(51) Int. Cl.
    *H01L 29/49*      (2006.01)
    *H01L 29/786*     (2006.01)
(52) U.S. Cl.
    CPC ...... *H01L 27/1248* (2013.01); *H01L 27/1259* (2013.01); *H01L 27/1262* (2013.01); *H01L 28/55* (2013.01); *H01L 29/4908* (2013.01); *H01L 29/78675* (2013.01)
(58) Field of Classification Search
    CPC . H01L 27/1259; H01L 28/55; H01L 29/4908; H01L 29/78675; H01L 21/02274; H01L 21/0228; H01L 29/786; H01L 2924/0104; H01L 29/78666; H01L 29/66757; H01L 29/78648; H01L 51/0516–0537
    USPC .......................................................... 257/71
    See application file for complete search history.

(56) References Cited

U.S. PATENT DOCUMENTS

| | | | |
|---|---|---|---|
| 6,621,103 | B2 | 9/2003 | Yamada |
| 7,408,192 | B2 | 8/2008 | Kang |
| 7,742,041 | B2 | 6/2010 | Lee et al. |
| 7,850,500 | B2 | 12/2010 | Park et al. |
| 8,115,262 | B2 | 2/2012 | Kim et al. |
| 8,115,883 | B2 | 2/2012 | Yamazaki et al. |
| 8,637,868 | B2 | 1/2014 | Choi et al. |
| 8,729,556 | B2 | 5/2014 | Kuriyagawa et al. |
| 8,766,267 | B2 | 7/2014 | Liu et al. |
| 8,772,777 | B2 | 7/2014 | Lee et al. |
| 2008/0204619 | A1 | 8/2008 | Saitou et al. |
| 2009/0114995 | A1* | 5/2009 | Suzuki ............. H01L 21/26506 257/369 |
| 2009/0278120 | A1* | 11/2009 | Lee .................... H01L 29/7869 257/43 |
| 2009/0278131 | A1 | 11/2009 | Kwon et al. |
| 2010/0026923 | A1 | 2/2010 | Chen et al. |
| 2010/0207247 | A1* | 8/2010 | Kim ....................... H01L 28/40 257/532 |
| 2010/0244111 | A1* | 9/2010 | Chen ................. G02F 1/136213 257/296 |
| 2011/0194062 | A1 | 8/2011 | Lee |
| 2011/0297945 | A1* | 12/2011 | Jung ................ G02F 1/136213 257/59 |
| 2012/0021612 | A1* | 1/2012 | Nakagawa ............. C23C 14/08 438/785 |
| 2012/0058598 | A1* | 3/2012 | Yamazaki ......... H01L 21/02554 438/104 |
| 2012/0080681 | A1 | 4/2012 | Kim et al. |
| 2012/0280236 | A1 | 11/2012 | Kim |
| 2013/0075799 | A1* | 3/2013 | Oyamada ........... H01L 27/1255 257/296 |
| 2013/0084713 | A1* | 4/2013 | Lee .................. H01L 21/28185 438/763 |
| 2013/0217202 | A1* | 8/2013 | Malhotra ............... H01L 28/40 438/396 |
| 2013/0320314 | A1 | 12/2013 | Kim et al. |
| 2015/0048320 | A1* | 2/2015 | Lee ..................... H01L 27/1255 257/40 |
| 2015/0055073 | A1 | 2/2015 | Kim et al. |
| 2015/0070643 | A1* | 3/2015 | Kim .................. G02F 1/136213 349/139 |
| 2015/0212380 | A1 | 7/2015 | Chen et al. |
| 2015/0228710 | A1* | 8/2015 | Rui ..................... H01L 27/1085 438/396 |
| 2015/0349254 | A1* | 12/2015 | Chang ................. H01L 45/1233 257/528 |
| 2016/0133691 | A1* | 5/2016 | Phatak .................... H01L 28/75 257/532 |
| 2016/0141346 | A1 | 5/2016 | You |
| 2016/0141372 | A1* | 5/2016 | Sasaki ..................... H01L 29/78 257/43 |
| 2016/0190224 | A1* | 6/2016 | Kim ..................... H01L 27/124 257/40 |
| 2016/0315088 | A1* | 10/2016 | Kang ................. H01L 27/10814 |
| 2016/0336311 | A1* | 11/2016 | Kim ........................ H01L 28/60 |
| 2017/0141169 | A1* | 5/2017 | Sim ..................... H01L 27/3265 |

FOREIGN PATENT DOCUMENTS

| | | |
|---|---|---|
| JP | 2013073033 A | 4/2013 |
| JP | 2016106422 A | 6/2016 |
| KR | 20020064624 A | 8/2002 |
| KR | 100843143 B1 | 7/2008 |
| KR | 20080088083 A | 10/2008 |

OTHER PUBLICATIONS

Yeon et al., 'Structure and Electrical Properties of Al-Doped HfO2 and ZrO2 Films Grown via Atomic Layer Deposition on Mo Electrodes' (Year: 2014).*
International Search Report and Written Opinion for PCT/US2017/040718 dated Oct. 11, 2017.
Office Action from Taiwan Patent Application No. 106123345 dated Aug. 9, 2018.
Korean Final Office Action issued in Application No. 10-2018-7035785 dated Jul. 27, 2020.
Korean Office Action issued to 10-2020-7028059 dated Nov. 20, 2020.
Structure and Electrical Properties of Al-Doped Hf02 and Zr02 Films Grown via Atomic Layer Deposition on Mo Electrodes, Nov. 25, 2014.
China Office Action issued to 201780026072.5 dated Feb. 1, 2021.
Korean Office Action issued to 10-2020-7028059 dated May 28, 2021.
Korean Notice of Allowance issued to 10-2020-7028059 dated Jul. 21, 2021.

* cited by examiner

HYBRID HIGH-K DIELECTRIC MATERIAL FILM STACKS COMPRISING ZIRCONIUM OXIDE UTILIZED IN DISPLAY DEVICES

CROSS-REFERENCE TO RELATED APPLICATIONS

This application claims benefit of U.S. Provisional Application Ser. No. 62/364,140 filed Jul. 19, 2016, which is incorporated by reference in its entirety.

BACKGROUND

Field

Embodiments of the present disclosure generally relate to forming a hybrid film stack having a high dielectric constant for display devices. More particularly, embodiments of the disclosure relate to methods for forming a hybrid film stack having a film layer with a high dielectric constant fabricated by an atomic layer deposition (ALD) process with high film density and low film leakage for display applications.

Description of the Related Art

Display devices have been widely used for a wide range of electronic applications, such as TVs, monitors, mobile phone, MP3 players, e-book readers, personal digital assistants (PDAs) and the like. The display device is generally designed for producing a desired image by applying an electric field to a liquid crystal that fills a gap between two substrates (e.g., a pixel electrode and a common electrode) and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display. In the manufacturing of display devices, an electronic device with high electron mobility, low leakage current and high breakdown voltage, would allow more pixel area for light transmission and integration of circuitry, thereby resulting in a brighter display, higher overall electrical efficiency, faster response time and higher resolution displays. Low film qualities of the material layers, such as dielectric layers with impurities or low film densities, formed in the device often result in poor device electrical performance and short service life of the devices. Thus, a stable and reliable method for forming and integrating film layers within TFT and OLED devices becomes crucial to providing a device structure with low film leakage, and high breakdown voltage, for use in manufacturing electronic devices with lower threshold voltage shift and improved the overall performance of the electronic device.

In particular, the interface management between a metal electrode layer and the nearby insulating materials becomes critical as improper material selection of the interface between the metal electrode layer and the nearby insulating material may adversely result in undesired elements diffusing into the adjacent materials, which may eventually lead to current short, current leakage or device failure. Furthermore, the insulating materials with different, higher dielectric constants often provide different electrical performance, such as providing different capacitance in the device structures. Selection of the material of the insulating materials not only affects the electrical performance of the device, incompatibility of the material of the insulating materials to the electrodes may also result in film structure peeling, poor interface adhesion, or interface material diffusion, which may eventually lead to device failure and low product yield.

In some devices, capacitors, e.g., a dielectric layer placed between to electrodes, are often utilized and formed to store electric charges when the display devices are in operation. The capacitor as formed is required to have high capacitance for display devices. The capacitance may be adjusted by changing of the dielectric material and dimension of the dielectric layer formed between the electrodes and/or thickness of the dielectric layer. For example, when the dielectric layer is replaced with a material having a higher dielectric constant, the capacitance of the capacitor will increase as well. As the resolution requirement for display devices is increasingly challenging, e.g., display resolution greater than 800 ppi, only limited areas are remained in the display devices to allow forming capacitors therein to increase electrical performance. Thus, maintaining the capacitor formed in the display devices in a confined location with a relatively small area has become crucial.

Therefore, there is a need for improved methods for forming a dielectric layer with a high dielectric constant with desired film qualities and low leakage for manufacturing display devices that produce improved device electrical performance.

SUMMARY

Embodiments of the disclosure generally provide methods of forming a hybrid film stack that may be used as a capacitor layer or a gate insulating layer with a high dielectric constant as well as film qualities for display applications. In one embodiment, a thin film transistor structure includes gate, source and drain electrodes formed on a substrate, and an insulating layer formed on a substrate, wherein the insulating layer is a hybrid film stack having a dielectric layer comprising a zirconium containing material disposed on an interface layer formed above or below the gate, source and drain electrodes.

In another embodiment, a method for forming a hybrid film stack for display devices includes forming an interface layer of a hybrid film stack on a substrate, and forming a dielectric layer of the hybrid film stack by an ALD process on the interface layer, wherein the dielectric layer comprises zirconium containing material, wherein the hybrid film stack is utilized as a capacitor layer or an insulating layer in display devices.

In yet another embodiment, a device structure utilized for display devices includes a hybrid film stack using as a capacitor structure formed between two electrodes in display devices, wherein the hybrid film stack comprises an interface layer and a Zr containing layer formed on the interface layer.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure generally provide methods of forming a hybrid film stack having a high dielectric constant greater than 9 with enhanced electrical performance, such as high capacitance and low leakage, with a high dielectric constant for display devices. Such dielectric layers with a high dielectric constant may be formed as a capacitor, a gate insulating layer, or any suitable insulating materials in display devices. The hybrid film stack having a high dielectric constant may be formed by a combination of chemical vapor deposition (e.g., PECVD or MOCVD) process and an atomic layer deposition (ALD) process (or a plasma enhanced ALD (PE-ALD)) that may provide a film stack with low defect density, low impurities, low film leakage and high dielectric constant. The hybrid film stack having a high dielectric constant may be utilized in any insulating structure and/or capacitor structures in TFT devices or OLED devices. In one example, the hybrid film stack with the high dielectric constant may be used in any suitable layers, such as a gate insulating layer, a capacitor layer formed between two electrodes, an inter-insulating layer, an etching stop layer or an interface protection layer in display devices for electric performance enhancement and improvement.

In some examples, the zirconium containing material as described in this disclosure may be exchanged or replaced with hafnium (Hf) containing material, including hafnium oxide, doped hafnium, doped hafnium oxide or the like.

Figure 1:
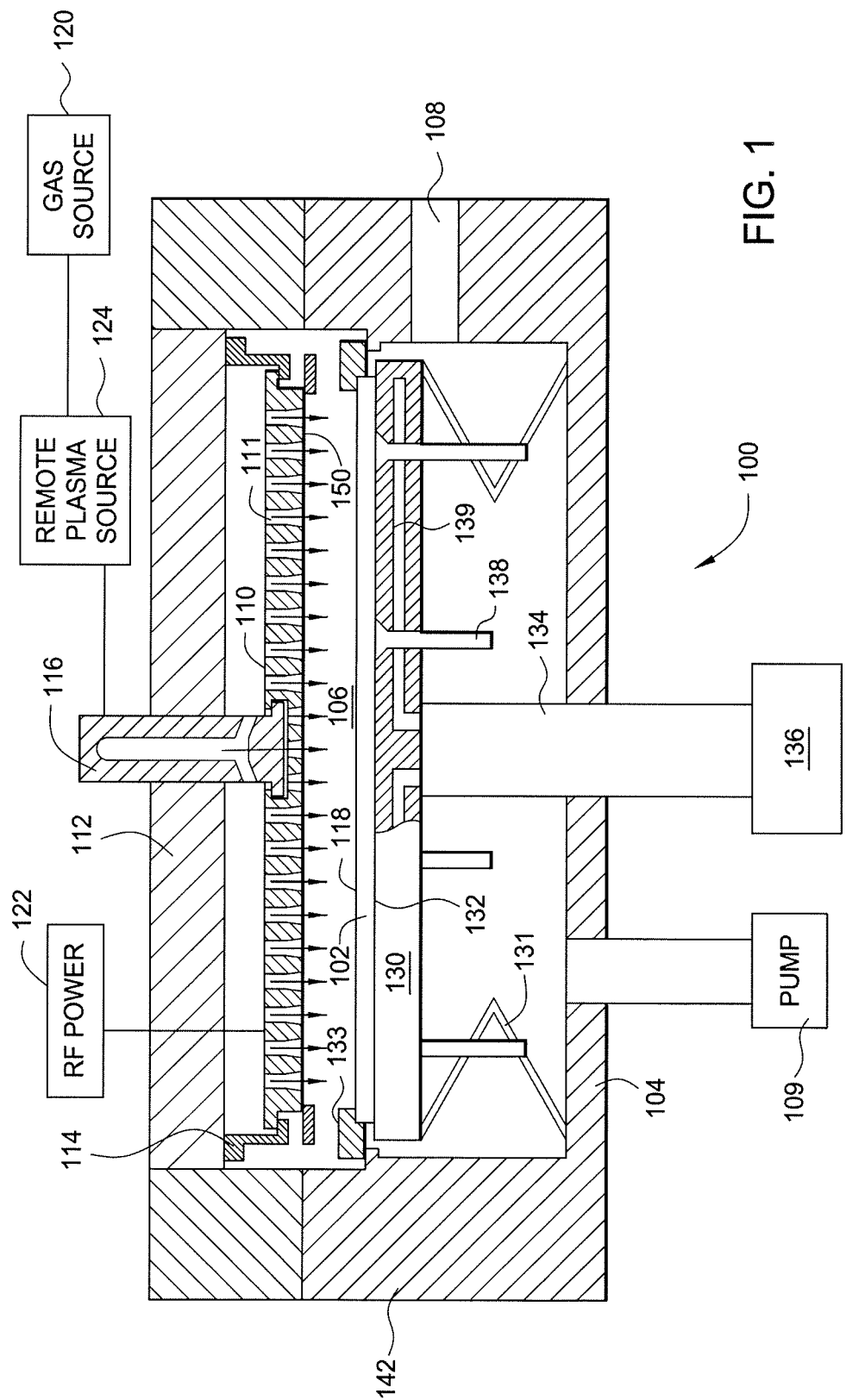
FIG. 1 depicts a sectional view of a processing chamber that may be used to deposit a dielectric layer in accordance with one embodiment of the present disclosure.

FIG. 1 is a schematic cross-section view of one embodiment of a chemical vapor deposition processing chamber 100 in which a dielectric layer, such as an insulating layer, a capacitor layer formed between two electrodes, a gate insulating layer, an etch stop layer, a passivation layer, an interlayer insulator, a dielectric layer for capacitors or passivation layer in display device structures, may be deposited. One suitable chemical vapor deposition chamber, such as plasma enhanced CVD (PECVD), is available from Applied Materials, Inc., located in Santa Clara, Calif. It is contemplated that other deposition chambers, including those from other manufacturers, may be utilized to practice the present disclosure.

The chamber 100 generally includes walls 142, a bottom 104 and a lid 112 which bound a process volume 106. A gas distribution plate 110 and substrate support assembly 130 are disposed with in a process volume 106. The process volume 106 is accessed through a slit valve opening 108 formed through the wall 142 such that a substrate 102 may be transferred in to and out of the chamber 100.

The substrate support assembly 130 includes a substrate receiving surface 132 for supporting the substrate 102 thereon. A stem 134 couples the substrate support assembly 130 to a lift system 136 which raises and lowers the substrate support assembly 130 between substrate transfer and processing positions. A shadow frame 133 may be optionally placed over periphery of the substrate 102 when processing to prevent deposition on the edge of the substrate 102. Lift pins 138 are moveably disposed through the substrate support assembly 130 and are adapted to space the substrate 102 from the substrate receiving surface 132. The substrate support assembly 130 may also include heating and/or cooling elements 139 utilized to maintain the substrate support assembly 130 at a desired temperature. The substrate support assembly 130 may also include grounding straps 131 to provide an RF return path around the periphery of the substrate support assembly 130.

The gas distribution plate 110 is coupled at its periphery to a lid 112 or wall 142 of the chamber 100 by a suspension 114. The gas distribution plate 110 is also coupled to the lid 112 by one or more center supports 116 to help prevent sag and/or control the straightness/curvature of the gas distribution plate 110. It is contemplated that the one or more center supports 116 may not be utilized. The gas distribution plate 110 may have different configurations with different dimensions. In an exemplary embodiment, the gas distribution plate 110 has a quadrilateral plan shape. The gas distribution plate 110 has a downstream surface 150 having a plurality of apertures 111 formed therein facing an upper surface 118 of the substrate 102 disposed on the substrate support assembly 130. The apertures 111 may have different shapes, number, densities, dimensions, and distributions across the gas distribution plate 110. In one embodiment, a diameter of the apertures 111 may be selected between about 0.01 inch and about 1 inch.

A gas source 120 is coupled to the lid 112 to provide gas through the lid 112 and then through the apertures 111 formed in the gas distribution plate 110 to the process volume 106. A vacuum pump 109 is coupled to the chamber 100 to maintain the gas in the process volume 106 at a desired pressure.

An RF power source 122 is coupled to the lid 112 and/or to the gas distribution plate 110 to provide a RF power that creates an electric field between the gas distribution plate 110 and the substrate support assembly 130 so that a plasma may be generated from the gases present between the gas distribution plate 110 and the substrate support assembly 130. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 150 of the gas distribution plate 110 may be curved so that a spacing gradient is defined between the edge and corners of the gas distribution plate 110 and substrate receiving surface 132 and, consequently, between the gas distribution plate 110 and the upper surface 118 of the substrate 102. The shape of the downstream surface 150 may be selected to meet specific process requirements. For example, the shape of the downstream surface 150 may be convex, planar, concave or other suitable shape. Therefore, the edge to corner spacing gradient may be utilized to tune the film property uniformity across the edge of the substrate, thereby correcting property non-uniformity in films disposed in the corner of the substrate. Additionally, the edge to center spacing may also be controlled so that the film property distribution uniformity may be controlled between the edge and center of the substrate. In one embodiment, a concave curved edge of the gas distribution plate 110 may be used so the center portion of the edge of the gas distribution plate 110 is spaced farther from the upper surface 118 of the substrate 102 than the corners of the gas distribution plate 110. In another embodiment, a convex curved edge of the gas distribution plate 110 may be used so that the corners of the gas distribution plate 110 are spaced farther than the edges of the gas distribution plate 110 from the upper surface 118 of the substrate 102.

A remote plasma source 124, such as an inductively coupled remote plasma source, may also be coupled between the gas source and the gas distribution plate 110. Between processing substrates, a cleaning gas may be energized in the remote plasma source 124 to remotely provide plasma utilized to clean chamber components. The cleaning gas entering the process volume 106 may be further excited by the RF power provided to the gas distribution plate 110 by the power source 122. Suitable cleaning gases include, but are not limited to, $NF_3$, $F_2$, and $SF_6$.

In one embodiment, the substrate 102 that may be processed in the chamber 100 may have a surface area of 10,000 $cm^2$ or more, such as 25,000 $cm^2$ or more, for example about 55,000 $cm^2$ or more. It is understood that after processing the substrate may be cut to form smaller other devices.

In one embodiment, the heating and/or cooling elements 139 may be set to provide a substrate support assembly temperature during deposition of about 600 degrees Celsius or less, for example between about 100 degrees Celsius and about 500 degrees Celsius, or between about 200 degrees Celsius and about 500 degrees Celsius, such as about 300 degrees Celsius and 500 degrees Celsius.

The nominal spacing during deposition between the upper surface 118 of the substrate 102 disposed on the substrate receiving surface 132 and the gas distribution plate 110 may generally vary between 400 mil and about 1,200 mil, such as between 400 mil and about 800 mil, or other distance required to obtain desired deposition results. In one exemplary embodiment wherein the gas distribution plate 110 has a concave downstream surface, the spacing between the center portion of the edge of the gas distribution plate 110 and the substrate receiving surface 132 is between about 400 mils and about 1400 mils, and the spacing between the corners of the gas distribution plate 110 and the substrate receiving surface 132 is between about 300 mils and about 1200 mils.

Figure 2:
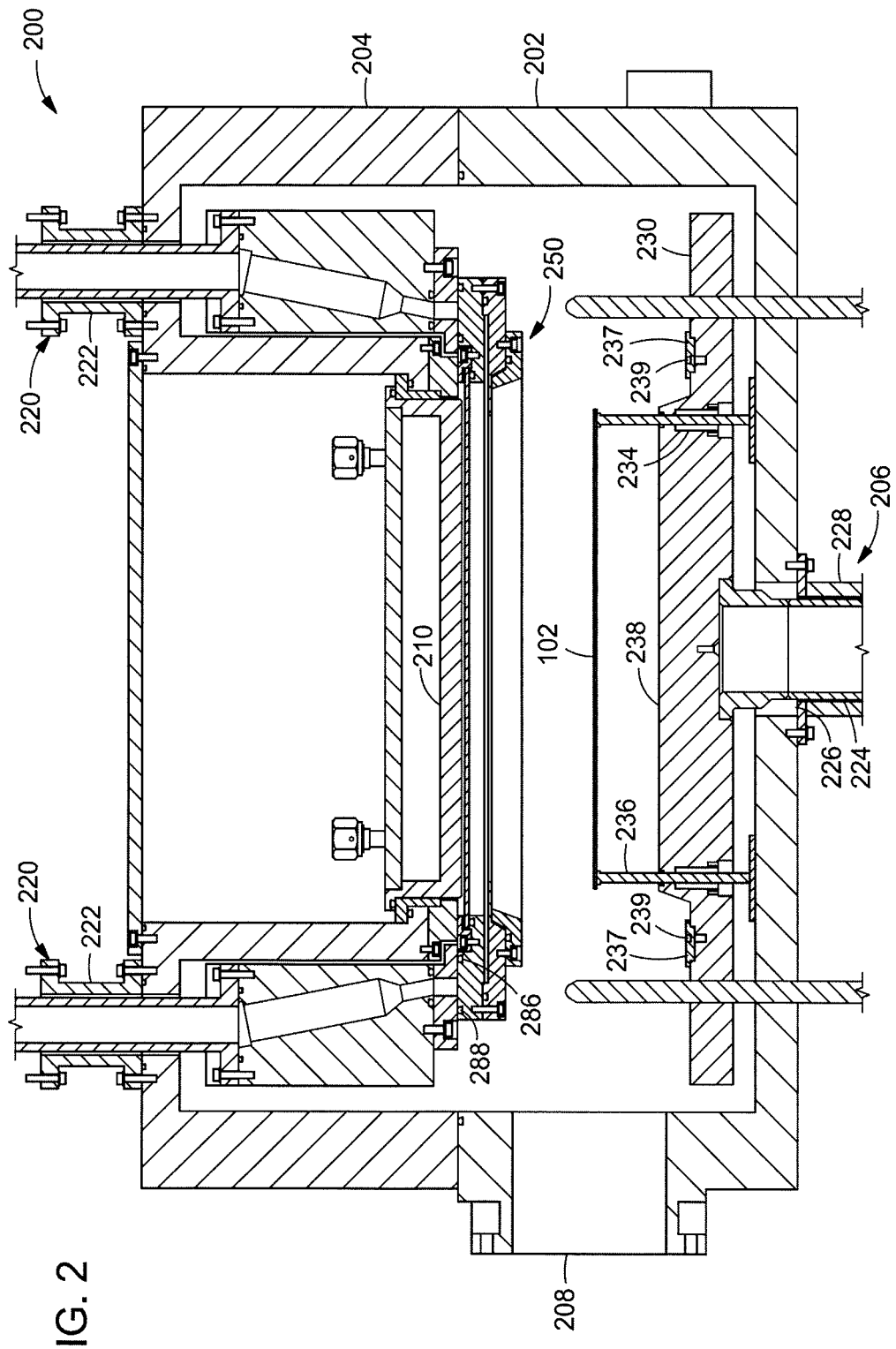
FIG. 2 depicts a sectional view of a processing chamber that may be used to deposit a dielectric layer in accordance with one embodiment of the present disclosure.

FIG. 2 is a schematic cross sectional view of an ALD (atomic layer deposition) chamber 200 that may be used to perform a deposition described herein. The ALD deposition process may be utilized to form a dielectric layer, such as an insulating layer, a gate insulating layer, an etch stop layer, an interlayer insulator, a dielectric layer for capacitor or passivation layer in display devices as described herein. The chamber 200 generally includes a chamber body 202, a lid assembly 204, a substrate support assembly 206, and a process kit 250. The lid assembly 204 is disposed on the chamber body 202, and the substrate support assembly 206 is at least partially disposed within the chamber body 202. The chamber body 202 includes a slit valve opening 208 formed in a sidewall thereof to provide access to the interior of the processing chamber 200. In some embodiments, the chamber body 202 includes one or more apertures that are in fluid communication with a vacuum system (e.g., a vacuum pump). The apertures provide an egress for gases within the chamber 200. The vacuum system is controlled by a process controller to maintain a pressure within the ALD chamber 200 suitable for ALD processes. The lid assembly 204 may include one or more differential pumps and purge assemblies 220. The differential pump and purge assemblies 220 are mounted to the lid assembly 204 with bellows 222. The bellows 222 allow the pump and purge assemblies 220 to move vertically with respect to the lid assembly 204 while still maintaining a seal against gas leaks. When the process kit 250 is raised into a processing position, a compliant first seal 286 and a compliant second seal 288 on the process kit 250 are brought into contact with the differential pump and purge assemblies 220. The differential pump and purge assemblies 220 are connected with a vacuum system (not shown) and maintained at a low pressure.

As shown in FIG. 2, the lid assembly 204 includes a RF cathode 210 that can generate a plasma of reactive species within the chamber 200 and/or within the process kit 250. The RF cathode 210 may be heated by electric heating elements (not shown), for example, and cooled by circulation of cooling fluids, for example. Any power source capable of activating the gases into reactive species and maintaining the plasma of reactive species may be used. For example, RF or microwave (MW) based power discharge techniques may be used. The activation may also be generated by a thermally based technique, a gas breakdown technique, a high intensity light source (e.g., UV energy), or exposure to an x-ray source.

The substrate support assembly 206 can be at least partially disposed within the chamber body 202. The substrate support assembly 206 can include a substrate support member or susceptor 230 to support a substrate 102 for processing within the chamber body. The susceptor 230 may be coupled to a substrate lift mechanism (not shown) through a shaft 224 or shafts 224 which extend through one or more openings 226 formed in a bottom surface of the chamber body 202. The substrate lift mechanism can be flexibly sealed to the chamber body 202 by a bellows 228 that prevents vacuum leakage from around the shafts 224. The substrate lift mechanism allows the susceptor 230 to be moved vertically within the ALD chamber 200 between a lower robot entry position, as shown, and processing, process kit transfer, and substrate transfer positions. In some embodiments, the substrate lift mechanism moves between fewer positions than those described.

In some embodiments, the substrate 102 may be secured to the susceptor using a vacuum chuck (not shown), an electrostatic chuck (not shown), or a mechanical clamp (not shown). The temperature of the susceptor 230 may be controlled (by, e.g., a process controller) during processing in the ALD chamber 200 to influence temperature of the substrate 102 and the process kit 250 to improve performance of the ALD processing. The susceptor 230 may be heated by, for example, electric heating elements (not shown) within the susceptor 230. The temperature of the susceptor 230 may be determined by pyrometers (not shown) in the chamber 200, for example.

As shown in FIG. 2, the susceptor 230 can include one or more bores 234 through the susceptor 230 to accommodate one or more lift pins 236. Each lift pin 236 is mounted so that the lift pin 236 may slide freely within a bore 234. The support assembly 206 is movable such that the upper surface of the lift pins 236 can be located above the substrate support surface 238 of the susceptor 230 when the support assembly 206 is in a lower position. Conversely, the upper surface of the lift pins 236 is located below the upper substrate support surface 238 of the susceptor 230 when the support assembly 206 is in a raised position. When contacting the chamber body 202, the lift pins 236 push against a lower surface of the substrate 102, lifting the substrate off the susceptor 230. Conversely, the susceptor 230 may raise the substrate 102 off of the lift pins 236.

In some embodiments, the susceptor 230 includes process kit insulation buttons 237 that may include one or more compliant seals 239. The process kit insulation buttons 237 may be used to carry the process kit 250 on the susceptor 230. The one or more compliant seals 239 in the process kit insulation buttons 237 are compressed when the susceptor lifts the process kit 250 into the processing position.

Figure 3:
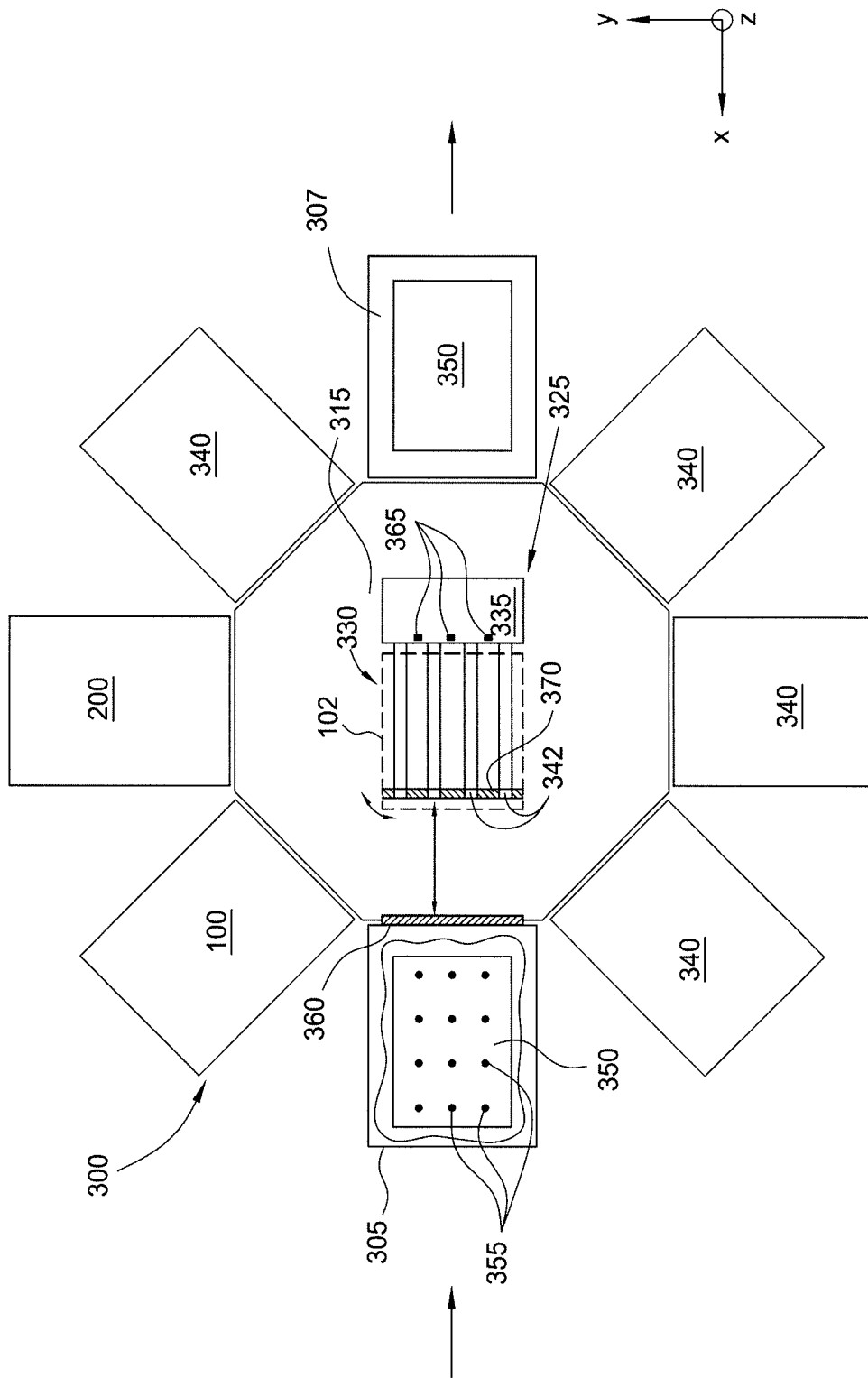
FIG. 3 is a schematic view of a multi-chamber substrate processing system including processing chambers described herein

FIG. 3 is a top plan view of a multi-chamber substrate processing system 300 suitable for the fabrication of any suitable display devices, such as organic light emitting diodes (OLEDS), thin-film transistors (TFT), thin-film encapsulation (TFE), and solar cell fabrication on flat media. The system 300 includes a plurality of processing chambers 100, 200, 340 and one or more load lock chambers 305, 307 positioned around a central transfer chamber 315. The processing chambers 100, 200, 340 may be configured to complete a number of different processing steps to achieve a desired processing of flat media, such as a large area substrate 102 (outlined in dashed lines). The load lock chambers 305, 307 are configured to transfer a substrate in a quadrilateral form from an ambient environment outside the multi-chamber substrate processing system 300 to a vacuum environment inside the transfer chamber 315.

Positioned within the transfer chamber 315 is a transfer robot 325 having an end effector 330. The end effector 330 is configured to be supported and move independently of the transfer robot 325 to transfer the substrate 102. The end effector 330 includes a wrist 335 and a plurality of fingers 342 adapted to support the substrate 102. In one embodiment, the transfer robot 325 is configured to be rotated about a vertical axis and/or linearly driven in a vertical direction (Z direction) while the end effector 330 is configured to move linearly in a horizontal direction (X and/or Y direction) independent of and relative to the transfer robot 325. For example, the transfer robot 325 raises and lowers the end effector 330 (Z direction) to various elevations within the transfer chamber 315 to align the end effector 330 with openings in the processing chambers 100, 200, 340 and the load lock chambers 305, 307. When the transfer robot 325 is at a suitable elevation, the end effector 330 is extended horizontally (X or Y direction) to transfer and/or position the substrate 102 into and out of any one of the processing chambers 100, 200, 340 and the load lock chambers 305, 307. Additionally, the transfer robot 325 may be rotated to align the end effector 330 with other processing chambers 100, 200, 340 and the load lock chambers 305, 307.

In one example, the processing chambers 100, 200, 340 incorporated in the multi-chamber substrate processing system 300 may be the chemical vapor deposition (PECVD or MOCVD) chamber 100 depicted in FIG. 1 and the atomic layer deposition (ALD) (or a plasma enhanced ALD (PE-ALD) chamber) chamber 200 depicted in FIG. 2 and/or other suitable chambers, such as HDP-CVD, MOCVD, PECVD, ALD, PE-ALD thermal CVD, thermal annealing, PVD, surface treatment, electron beam (e-beam) treatment, plasma treatment, etching chambers, ion implantation chambers, surface cleaning chamber, metrology chambers, spin-coating chamber, polymer spinning deposition chamber, shadow frame storage chamber or any suitable chambers as needed. In one example depicted in the multi-chamber substrate processing system 300, the system 300 includes the chemical vapor deposition (such as a PECVD) chamber 100, the atomic layer deposition (ALD) chamber 200 (or a plasma enhanced ALD (PE-ALD) chamber) and other suitable chambers 340 as needed. By such arrangement, the dielectric layer formed by the ALD process and/or the PECVD process may also be integrated to perform in a single chamber without breaking vacuum so as to maintain cleanliness of the substrate without undesired contamination and residuals from the environment.

A portion of the interior of load lock chamber 305 has been removed to expose a substrate support or susceptor 350 that is adapted to receive and support the large area substrate 102 during processing. The susceptor 350 includes a plurality of lift pins 355 that are movable relative to an upper surface of the susceptor 350 to facilitate transfer of the large area substrate 102. In one example of a transfer process of the large area substrate 102, the lift pins 355 are extended away from or above the upper surface of the susceptor 350. The end effector 330 extends in the X direction into the processing chamber 100, 200, 340 or load lock chambers 305, 307 above the extended lift pins. The transfer robot 325 lowers the end effector 330 in the Z direction until the large area substrate 102 is supported by the lift pins 355. The lift pins 355 are spaced to allow the fingers 342 of the end effector 330 to pass the lift pins 355 without interference. The end effector 330 may be further lowered to assure clearance between the large area substrate 102 and the fingers 342 and the end effector 330 is retracted in the X direction into the transfer chamber 315. The lift pins 355 may be retracted to a position that is substantially flush with the upper surface of the susceptor 350 in order to bring the large area substrate 102 into contact with the susceptor 350 so the susceptor 350 supports the large area substrate 102. A slit valve or door 360 between the transfer chamber 315 and the load lock chamber 305, 307 (or the processing chamber or 100, 200, 340) may be sealed and processing may be commenced in the load lock chamber 305, 307 (or the processing chambers 100, 200, 340). To remove the large area substrate 102 after processing, the transfer process may be reversed, wherein the lift pins 355 raise the large area substrate 102 and the end effector 330 may retrieve the large area substrate 102. In one example, the substrate 102 may be transferred into the multi-chamber substrate processing system 300 through the first load lock chamber 305. After the substrate 102 is oriented and aligned to a desired position, the substrate 102 is then transferred to any one of the processing chambers 100, 200, 340 through the transfer chamber 315 to perform any suitable processes as needed to form a device structure on the substrate 102. After the processes are completed in the processing chambers 100, 200, 340, then the substrate 102 is removed from and transferred out of the multi-chamber substrate processing system 300 from the second load lock chamber 307 as needed.

The environment in the substrate processing system 300 is isolated from ambient pressure (i.e. pressure outside the system 300) and is maintained at a negative pressure by one or more vacuum pumps (not shown). During processing, the processing chambers 100, 200, 340 are pumped down to pre-determined pressures configured to facilitate thin film deposition and other processes. Likewise, the transfer chamber 315 is held at a reduced pressure during transfer of the large area substrates to facilitate a minimal pressure gradient between the processing chambers 100, 200, 340 and the transfer chamber 315. In one embodiment, the pressure in the transfer chamber 315 is maintained at a pressure lower than ambient pressure. For example, the pressure in the transfer chamber may be about 7 Torr to about 10 Torr while the pressure in the processing chambers 100, 200, 340 may be lower. In one embodiment, the maintained pressure within the transfer chamber 315 may be substantially equal to the pressure within the processing chambers 100, 200, 340 and/or load lock chambers 305 and 307 to facilitate a substantially equalized pressure in the system 300.

During the transfer of the large area substrate 102 in the transfer chamber 315 and the processing chambers 100, 200, 340, proper alignment of the large area substrate 102 is crucial to prevent collisions and/or damage of the large area substrate 102. Additionally, the interior of the system 300 must be kept clean and free from debris such as broken pieces of a substrate, broken equipment, and other particulate contamination. While some conventional systems include view windows allowing line of sight viewing into the interior of the various chambers 100, 200, 340, the windows may not allow a full view and/or precise inspection of the large area substrates and the interior of the various chambers 100, 200, 340. Also, the conventional systems are not configured to view the large area substrate 102 and provide a metric of processing results while the large area substrates are in the system.

The transfer robot 325 includes one or more optical image sensors 365 and 370 disposed on the transfer robot 325 as needed. The one or more optical image sensors 365, 370 may be optical scanners, imagers or cameras, such as a charged-coupled device (CCD), a complementary metal oxide semiconductor (CMOS) device, a video camera, and the like. In one embodiment, one or more of the optical image sensors 365, 370 are mounted on the transfer robot 325 in a position to view the large area substrate 102, the fingers 342 and any object in the line of sight view of the sensors 365, 370. In this embodiment, the image sensors 365, 370 may be oriented to view objects substantially in the X and Y direction as well as the Z direction as the transfer robot 325 is stationary or moving in the system 300. The image sensors 365, 370 may include wide angle optics, such as a fisheye lens, to enable a greater field of view.

Figure 4:
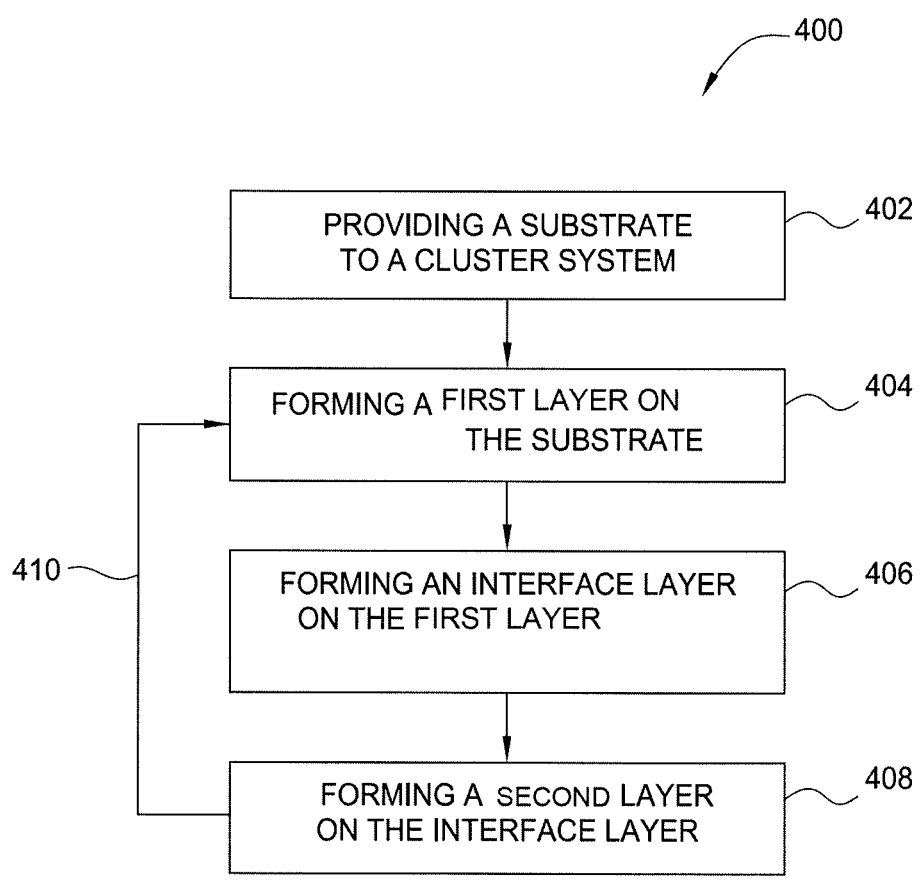
FIG. 4 depicts a process flow diagram of one embodiment of a method of forming a hydride film stack with high capacitance on a substrate.

FIG. 4 depicts a flow diagram of one embodiment of a process 400 for forming a hybrid film stack suitable for use in display devices, such as thin-film transistor devices or OLED devices. Such hybrid film stack may be formed as a capacitor layer disposed between two metal layers to form a capacitor, or an insulating layer in display devices. Suitable examples of the insulating layer used in display devices include a gate insulating layer, a capacitor layer disposed between two metal layers, an interface layer, a dielectric layer utilized to form a capacitor, an etch stop layer or a passivation layer where an insulating material is needed. The insulating layer may be formed by a plasma enhanced chemical vapor deposition (PECVD) process, which may be practiced in the processing chamber 100, as described in FIG. 1, and/or an atomic layer deposition (ALD) process (or a PEALD process), which may be practiced in the processing chamber 200, as described in FIG. 2, or other suitable processing chamber, or in combination thereof.

The process 400 begins at operation 402 by providing the substrate 102 in a processing chamber, such as the processing chamber 100 (a PECVD chamber) or processing chamber 200 (an ALD chamber or a PEALD chamber) depicted in FIG. 2, to form an insulating layer or a dielectric layer. The substrate 102 may have different combinations of films, structures or layers previously formed thereon to facilitate forming different device structures or different film stacks on the substrate 102. The substrate 102 may be any one of glass substrate, plastic substrate, polymer substrate, metal substrate, singled substrate, roll-to-roll substrate, or other suitable transparent substrate suitable for forming a thin film transistor thereon.

Figure 5A:
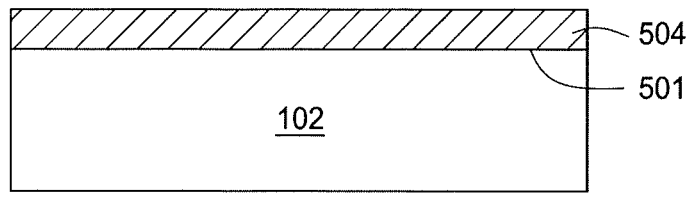
FIG. 5A-5E are sectional views of one example of a hydride film stack with high capacitance of FIG. 4 formed therein.

At operation 404, a deposition process is then performed on the substrate 102 to form a first layer 504 of a hybrid film stack 510 (depicted in FIG. 5C) on the substrate 102. In one example, the resultant hybrid film stack 510 may be formed as a gate insulating layer or a capacitor layer in display devices. In such example, the resultant hybrid film stack 510 of the gate insulating layer and/or the capacitor layer in display devices may be in form of multiple layers, which will be described later with reference to FIGS. 5B and 5C.

The first layer 504 is formed on a surface 501 of the substrate 102 by a plasma enhanced chemical vapor deposition (PECVD) process. The first layer 504 is a dielectric layer, such as a silicon containing layer. Suitable examples of the silicon containing layer may include silicon oxide, silicon oxynitride, silicon carbide, silicon oxycarbide or silicon nitride, formed by the CVD process. As silicon materials are widely used in display devices, the first layer 504 referred here could be any existing materials come with the substrate pre-formed in the display devices prior to a second layer 508 (depicted in FIG. 5B) to be formed thereon. In one example, the first layer 504 is a silicon nitride or a silicon oxide material.

In one example wherein the substrate 102 already includes a silicon containing material pre-fabricated thereon, the first layer 504 may be eliminated and the process 400 for forming the hybrid film stack 510 may be directly start from operation 406 to form the interface layer 506.

Figure 5B:
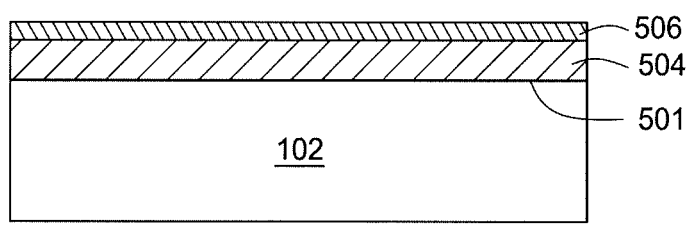
Figure 5C:
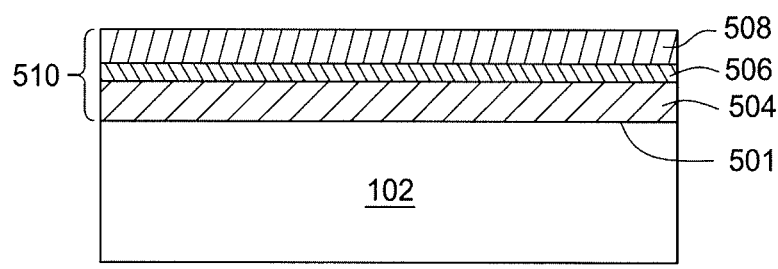

At operation 406, an interface layer 506 is formed on the first layer 504, as shown in FIG. 5B. As the second layer 508 (shown in FIG. 5C) formed thereon is a dielectric layer with high dielectric constant that includes certain metal elements, direct contact of the elements (e.g., metal elements or oxygen elements) from the second layer 508 with the silicon elements from the first layer 504 often result in interface diffusion, which may result in a undesired diffusion layer formed at the interface. The elements (e.g., metal elements or oxygen elements) from the second layer 508 diffused and penetrated into the first layer 504 forms a thin lower dielectric constant film (or other types of materials) at the interface deteriorating the film qualities of the overall hybrid film stack 510, especially the degrade of the dielectric constant of the hybrid film stack 510. Thus, by forming the interface layer 506 between the first layer 504 and the second layer 508, the second layer 508 is then interfaced with the interface layer 506, which is more inert to the film properties from both the first and the second layer 504, 508, rather than in direct contact with the first layer 504 so that good interface control may be obtained.

In the embodiments wherein the second layer 508 is manufactured from a material that does not create interface diffusion layer to the first layer 504, the interface layer 506 as described here may be eliminated. In such embodiments, the second layer 508 may be formed directly and in direct contact with the first layer 504.

In one example, the interface layer 506 is metal dielectric layer formed by a plasma enhanced chemical deposition process, such as the processing chamber 100 depicted in FIG. 1, or an atomic layer deposition processing chamber 200 (or a PE-ALD processing chamber) depicted in FIG. 2. In one example, the interface layer 506 may be an aluminum containing material, such as aluminum oxide ($Al_2O_3$), aluminum nitride (AlN) layer aluminum oxide ($Al_2O_3$), aluminum nitride (AlN), aluminum titanium oxide (AlTiO), aluminum zirconium oxide (AlZrO), or AlON, or a yttrium oxide containing material, such as $Y_2O_3$. In one particular example, the interface layer 506 is an aluminum oxide ($Al_2O_3$) or aluminum nitride (AlN) layer.

The ALD process is enabled by a slow deposition process with a first monolayer of atoms being absorbed and adhered on a second monolayer of atoms formed on a substrate surface. Strong adherence of atoms in each layers and absorbability of the layers of atoms onto the surface of substrate provide compact and secured bonding structures in the film structures so as to render a film property with a high film density (compared to a chemical vapor deposition process) that may efficiently prevent atoms or elements from penetrating therethrough. Furthermore, the slow ALD deposition rate of the interface layer 506 also allows the atoms from the interface layer 506 to gradually fill in the pinholes, pores, pits or defects that may be occurred from the substrate surface (e.g., the first layer 504 in the examples of FIG. 5B) so as to assist repairing the film defects from the substrate surface. In contrast, the conventional plasma enhanced chemical vapor deposition process (PECVD) often provides a relatively fast deposition process with high throughput but renders relatively porous film structures for the resultant film layer. The interface layer 506 serves as a barrier/blocking layer to prevent elements from the first and the second layers 504, 508 to penetrate or diffuse therethrough to undesirably alter the device performance. In the example wherein high throughput of the manufacturing cycles is desired, a plasma assisted atomic layer deposition (PE-ALD) process may be utilized instead to provide a relatively higher deposition rate (compared to thermal ALD) of deposition process while still maintaining the desired degree of film density. In some embodiment wherein even higher throughput of the manufacturing cycles is desired, the interface layer 506 may be configured to formed by a CVD process while the second layer 508, a high dielectric constant greater than 15, subsequently formed thereon is then formed by an ALD process to ensure the particular film properties, e.g., high film dielectric constant and low leakage, is achieved for the overall hybrid film stack 510.

In one example, the precursors used in the ALD process for forming the interface layer 506 as a $Al_2O_3$ layer includes at least a metal containing precursor, such as an aluminum containing gas, and a reacting gas. Suitable examples of the aluminum containing gas may have a formula of $R_xAl_yR'_zR''_v$ or $R_xAl_y(OR')_z$, where R, R' and R'' are H, $CH_3$, $C_2H_5$, $C_3H_7$, CO, NCO, alkyl or aryl group and x, y, z and v are integers having a range between 1 and 8. In another embodiment, the aluminum containing compound may have a formula of $Al(NRR')_3$, where R and R' may be H, $CH_3$, $C_2H_5$, $O_3H_7$, CO, NCO, alkyl or aryl group and R' may be H, $CH_3$, $C_2H_5$, $C_3H_7$, CO, NCO, alkyl or aryl group. Examples of suitable aluminum containing compounds are diethylalumium ethoxide ($Et_2AlOEt$), triethyl-tri-sec-butoxy dialumium ($Et_3Al_2OBu_3$, or EBDA), trimethylalumi-num (TMA), trimethyldialumium ethoxide, dimethyl aluminum isupropoxide, disecbutoxy aluminum ethoxide, (OR)$_2AlR'$, wherein R, R' and R'' may be methyl, ethyl, propyl, isopropyl, butyl, isobutyl, tertiary butyl, and other alkyl groups having higher numbers of carbon atoms, and the like.

The reacting gas that may be supplied to form aluminum containing material gas includes an oxygen containing gas, such as, oxygen ($O_2$), ozone ($O_3$), nitrogen ($N_2$), $N_2O$, $CO_2$, NO, CO, $CO_2$ and among others.

In one example, the interface layer may have a thickness of between about 1.5 Å and about 30 Å, such as about 10 Å.

At operation 408, after the interface layer 506 is formed on the first layer 504, the second layer 508 is then formed on the interface layer 506. The second layer 508 is formed by the atomic layer deposition process comprising Zr containing material. In one example, the second layer 508 is a Zr containing material, such as zirconium oxide ($ZrO_2$), formed in cubic or tetragonal structures, providing the second layer 508 with high dielectric constant greater than 25. A $ZrO_2$ layer formed by an atomic layer deposition process often predominately provides the resultant $ZrO_2$ in crystalline structure in cubic or tetragonal phase, providing a dielectric constant at least greater than 25, such as between about 25 and about 50. The Zr containing layer formed as the second layer 508 of the hybrid film stack 510 by an atomic layer deposition (ALD) process may provide good film properties, such as high film density, low defect density and the like as well as the desired high dielectric constant.

In one example, the precursor mixtures utilized to form the second layer 508 include alternatively or sequentially supplying a zirconium containing precursor with or without the reactive gaseous species to form an aluminum doped zirconium (Zr) containing layer. Suitable zirconium containing precursor include Zr-organometallic precursors, such as tetrakis(ethylmethylamino)zirconium (TEMAZ), tris(dimethylamino)cyclopentadienyl zirconium $(C_5H_5)Zr[N(CH_3)_2]_3$, or the like. In one particular example utilized herein, the zirconium containing precursor is tetrakis(ethylmethylamino)zirconium (TEMAZ). The reactive gaseous species may be oxygen containing gases, such as $H_2O$, $O_2$, $O_3$, $H_2O_2$, $CO_2$, $NO_2$, $N_2O$, and the like. In one example, the oxygen containing gas is $O_2$ or $O_3$.

In one example, the second layer 508 of the hybrid film stack 510 as formed may have a dielectric constant greater than 25, such as between 25 and 50. In one example, the second layer 508 of the hybrid film stack 510 has a thickness between about 250 Å and about 900 Å.

In some examples, the Zr containing layer formed in the second layer 508 may have dopants doped therein to keep a current leakage at a desired low level. As the dielectric constant of a material increases, the band gap of the material decreases, leading to high leakage current in the device. Thus, higher dielectric constant, e.g., greater than 25, of a dielectric layer is desired for the advanced technologies so as to provide a capacitor with higher capacitance. In contrast, higher dielectric constant, e.g., greater than 25, of the dielectric layer also often results in high film leakage that may eventually lead to device failure. Thus, by providing dopants, such as the aluminum dopants, into the Zr containing layer in the second layer 508, the crystalline structure of the Zr containing layer in the second layer 508 may be altered into an amorphous state, thus lowering the dielectric constant of a certain predetermined level so as to keep the current leakage at a desired low level. For example, by providing aluminum dopant into the $ZrO_2$ structure to form the second layer 508 may render the resultant $ZrO_2$ structure in amorphous state, thus, keeping the dielectric constant of the amorphous aluminum doped $ZrO_2$ at a desired range less than 25 but still above 15, such as between about 15 and 25. Alternatively, the second layer 508 may be formed including both amorphous and crystalline structures, such as a portion of the $ZrO_2$ layer with dopants and another portion without dopants (e.g., a hybrid bonding structure), so as to obtain the resultant hydride film stack 510 with desired dielectric constant level, as well as desired low leakage level and good interface control.

In the example wherein the doped $ZrO_2$ layer is used for the second layer 508, the doped $ZrO_2$ layer dielectric constant greater than 15, such as between 15 and 25 and a film leakage about 1E-8 $A/cm^2$ or below. The aluminum dopant in a $ZrO_2$ structure may have a doping concentration between about 6 atm. % and about 20 atm. %.

It is noted that the first layer 504, the interface layer 506 and the second layer 508 of the hybrid film stack 510 may be all formed in the same processing system, such as the processing system 300 depicted in FIG. 3 without breaking vacuum. For example, the first layer 504 may be formed in the processing 100 integrated in the processing system 300. The interface layer 506 may be formed in the processing chamber 100 or processing chamber 200 integrated in the processing system 300 while the second layer 508 may be formed in the processing chamber 200 all integrated in the processing system 300 as needed to save manufacturing cycling time as well as maintaining low substrate contaminant as needed.

It is noted that the operation 404, 406, 408 may be performed as many times as needed, as indicated by the loop 410, to cyclically form the first layer 504, the interface layer 506 and the second layer 508, until a desired number of the first layer 504, interface layer 506 and the second layer 508 are formed for the hybrid film stack 510. The process parameters in each operation may be changed when cyclically these operations to fine tune the film properties formed on the substrate. In the example depicted in FIG. 5D, an upper most first layer 504' and an upper most interface layer 506' and an upper most second layer 508' are formed to reach a desired thickness of the overall hybrid film stack 510.

Figure 5D:
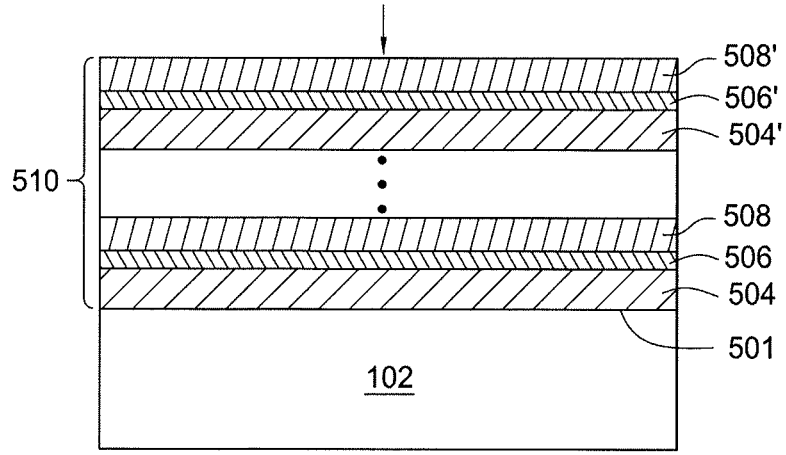

By forming the multiple layers for the hybrid film stack 510 as shown in FIG. 5D, the substrate 102 is transferred between the processing chamber (PECVD chamber) 100 and the processing chamber 200 (ALD chamber) as many times as needed to reach the desired thickness or the desired numbers of the first layer 504, interface layer 506 and the second layer 508 for the hybrid film stack 510. As discussed above, the processing chamber (PECVD chamber) 100 and the processing chamber 200 (ALD chamber) may be integrated in a single processing system, such as the processing system 300 in FIG. 3, the substrate 102 may be transferred in and out between the processing chamber (PECVD chamber) 100 and the processing chamber 200 (ALD chamber) in the processing system 300 without breaking vacuum so as to maintain the production efficiency and manufacturing throughput.

Figure 5E:
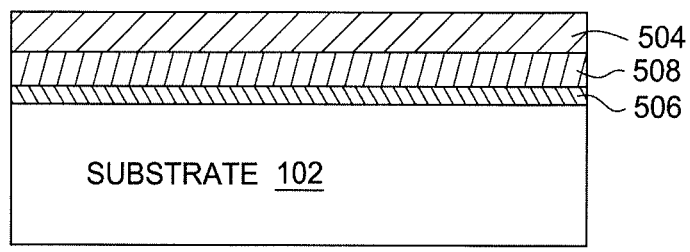

In some embodiments, the hybrid film stack 510 may start with the interface layer 506 and the second layer 508 formed on the substrate 102 followed by the first layer 504 formed on the second layer 508, as shown in FIG. 5E. Similarly, the interface layer 506, the second layer 508 and the first layer 504 may be formed multiple times (e.g., continuously cycling the substrate 102 between the ALD processing chamber 200 and the PECVD processing chamber 100) to form the interface layer 506, second layer 508 and the first layer 504 sequentially. In the embodiment where the interface layer 506 is not present, the second layer 508 may be directly formed on and in direct contact with the substrate 102 and the first layer formed on the substrate.

It is noted that the cycles of the depositions among operation 404 406, 408, as indicated by the loop 410, may be resumed or stopped in any operations as needed. The cycles of the depositions among operations 404 406, 408, as indicated by the loop 410, may also skip some operations as needed. For example, as discussed above, in the embodiment wherein interface layer 506 is not required, the cycles of deposition may be performed between operation 404 and 408 and the last operation may be terminated or stopped at operation 404 or 408 as needed. Alternatively, after a first cycle of deposition of operation 404, and/or 406 and/or 408 is completed, a second cycle of deposition may be started at any of the operation from operation 404, 406 or 408 as needed to any of the first layer 504, interface layer 506 and the second layer 508.

Although the loop 410 indicates the operations may be continuously performed, it is noted that the operation 404, 406, 408 may be cycled for one or two times, generally, to prevent over-heating to the substrate 102 or low manufacturing throughput. For example, the operation 404, 406, 408 may be looped for one or two times to form the hybrid film stack 510 including two layers of the second layer 508 formed on the first layer 504 (the interface layer 506 not present) or vice versa, or three layers having the first layer 504 sandwiched between two second layers 508, or three layers having the second layer 508 sandwiched between two first layers 504 (the interface layer 506 not present). The interface layer 506, when present, may be added at any interface below, above and between the first and the second layers 504, 508.

Figure 6A:
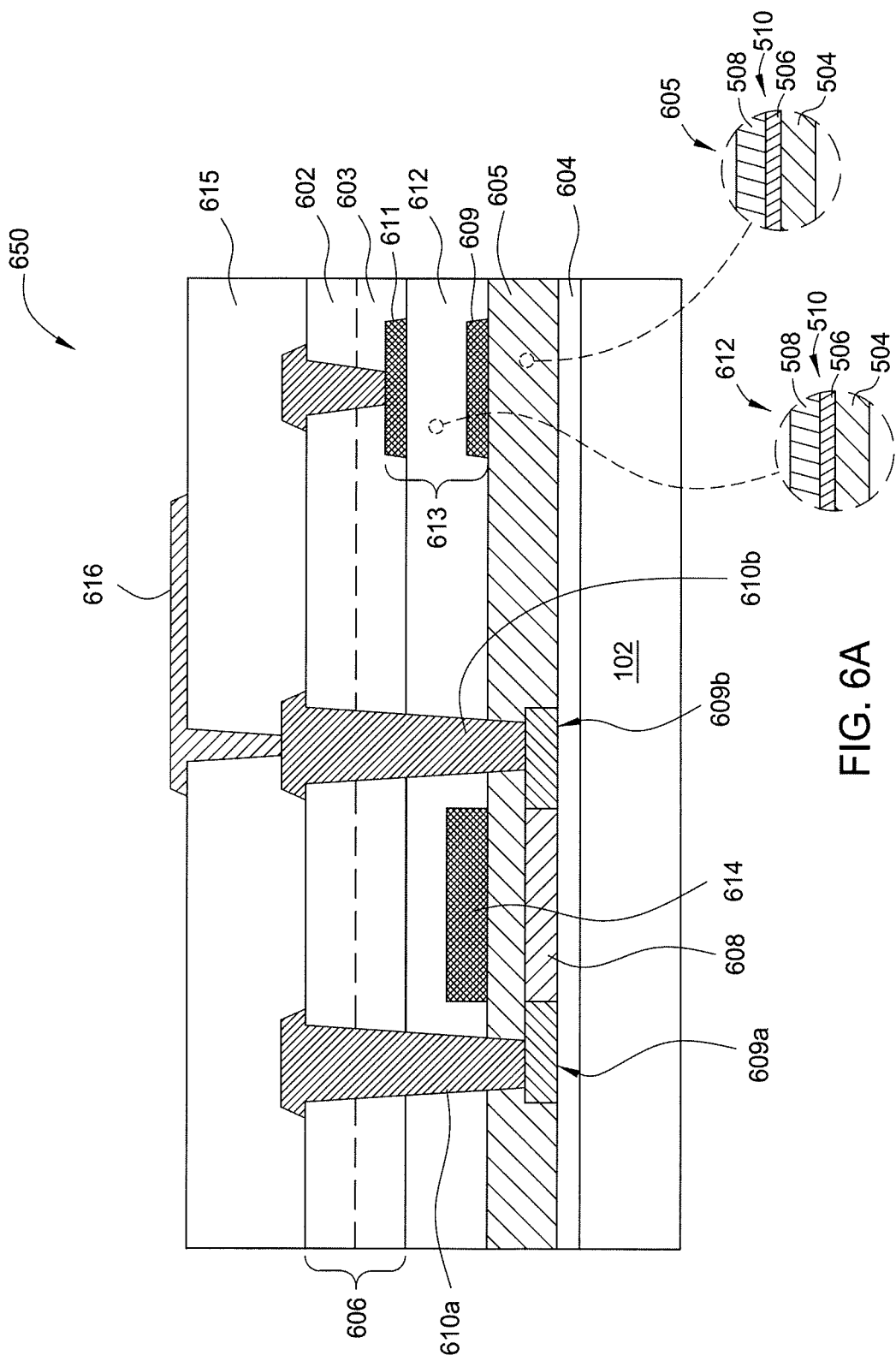
FIGS. 6A-6B are cross sectional views of different examples of a display device structure with the hydride film stack with high capacitance of FIG. 4 formed therein.

FIG. 6A depicts an example of a TFT device structure 650 utilizing the hybrid film stack 510 in the TFT device structure 650 to form a capacitor, or a gate insulating layer, or other suitable insulating layers. A portion of the exemplary TFT device structure 650 is depicted in FIG. 6A formed on the substrate 102. The TFT device structure 650 comprises a low temperature polysilicon (LTPS) TFT for OLED device. The LTPS TFT device structures 650 are MOS devices built with a source region 609a, channel region 608, and drain region 609b formed on the optically transparent substrate 102 with or without an optional insulating layer 604 disposed thereon. The source region 609a, channel region 608, and drain region 609b are generally formed from an initially deposited amorphous silicon (a-Si) layer that is typically later thermal or laser processed to form a polysilicon layer. The source, drain and channel regions 609a, 608, 609b can be formed by patterning areas on the optically transparent substrate 102 and ion doping the deposited initial a-Si layer, which is then thermally or laser processed (e.g., an Excimer Laser Annealing process) to form the polysilicon layer. A gate insulating layer 605 (e.g., the insulating layer or the hybrid film stack 510 with high dielectric constant formed by the process 400 of FIG. 4) may be then deposited on top of the deposited polysilicon layer(s) to isolate a gate electrode 614 from the channel region 608, source region 609a and drain regions 609b. The gate electrode 614 is formed on top of the gate insulating layer 605. The gate insulating layer 605 is also commonly known as a gate oxide layer. A capacitor layer 612 (e.g., may also be the insulating layer or the hybrid film stack 510 formed by the process 400 of FIG. 4) and device connections are then made through the insulating material to allow control of the TFT device. As indicated by the circles in FIG. 6A, the gate insulating layer 605 and the capacitor layer 612 in the TFT device structure 650 may also be fabricated by the hybrid film stack 510 with high dielectric constant as well as the low film leakage including the first layer 504 and the second layer 508 and the interface layer 506 formed therebetween. In the embodiment wherein the optional insulating layer 604 is present, the first layer 504 comprising the silicon containing layer may be eliminated as the optional insulating layer 604 and the first layer 504 may both be formed from a silicon material.

The TFT device structure 650 of FIG. 6A is just partially formed for ease of description and explanation regarding to where the hybrid film stack 510 may be utilized in some locations in the device structure 650 utilized to form either the gate insulating layer 605 or the capacitor layer 612, or both, in the device structure 650.

After the capacitor layer 612 is formed, an interlayer insulator 606 may be formed on the capacitor layer 612. The interlayer insulator 606 may be any suitable dielectric layer, such as silicon oxide or silicon nitride materials. The interlayer insulator 606 may be in form of a single layer formed on the capacitor layer 612. Alternatively, the interlayer insulator 606 may be in form of multiple layers as needed for different device requirements. In the example depicted in FIG. 6A, the interlayer insulator 606 includes a first dielectric layer 602 of silicon nitride formed on a second layer 603 of a silicon oxide layer. Subsequently, a source-drain metal electrode layer 610a, 610b is then deposited, formed and patterned in the interlayer insulator 606, the capacitor layer 612 and the gate insulating layer 605 electrically connected to the source region 609a and drain regions 609b.

After the source-drain metal electrode layer 610a, 610b is patterned, the planarization layer 615 is then formed over the source-drain metal electrode layer 610a, 610b. The planarization layer 615 may be fabricated from polyimide, benzocyclobutene-series resin, spin on glass (SOG) or acrylate. The planarization layer 615 is later patterned to allow a pixel electrode 616 to be formed on and filled in the planarization layer 615, electrically connecting to the source-drain metal electrode layer 610a, 610b.

In this example depicted in FIG. 5A, the capacitor layer 612 is formed on the gate electrode 614 extending to a capacitor structure 613 (e.g., a MIM (metal-insulating-metal) structure) formed between an upper electrode 611 and a lower electrode 609. The upper electrode 611 may be laterally coupled to the source-drain metal electrode layer 610a, 610b while the lower electrode 609 may be laterally coupled to the gate electrode 614, or other suitable electrodes in the device structure 650. The capacitor structure 613 formed in the device structure 650 may be a storage capacitor that may improve the display device electrical performance. It is noted that the capacitor structure 613 may be formed in any location suitable in the device structure 650 as needed for different device performance requirements.

Figure 6B:
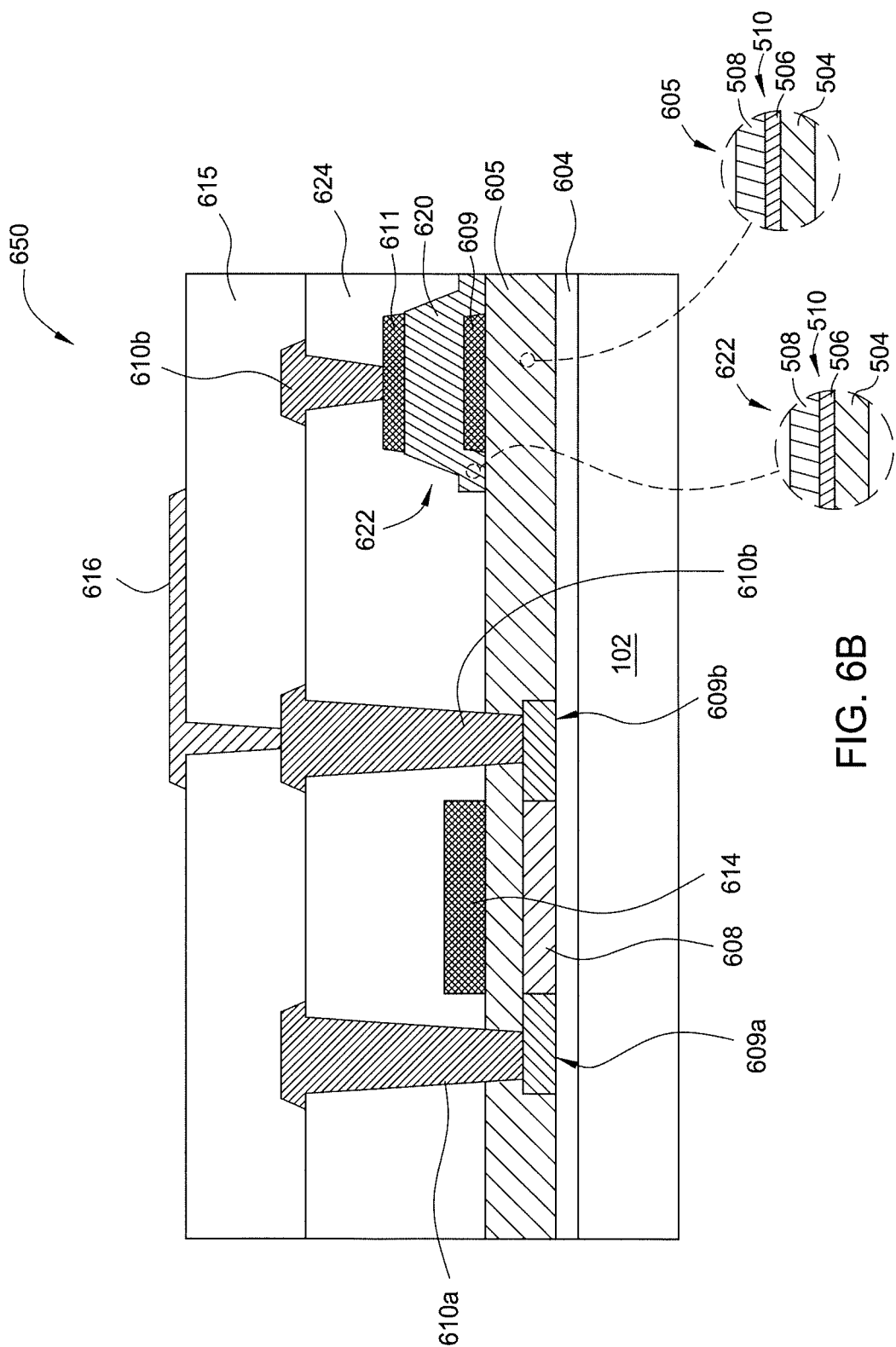

In another example depicted in FIG. 6B, a capacitor structure 622, similar to the capacitor structure 613 depicted in FIG. 6A, may be formed with different dimensions and/or profiles of the hybrid film stack 510 severing as a capacitor layer 620 formed between the upper electrode 611 and the lower electrode 609. Unlike the capacitor layer 612 shown in FIG. 6A that extends from the area above the gate electrode 614 to the area between the upper and the lower electrode 611, 609, the capacitor layer 620 depicted in FIG. 6B is formed substantially in the area between the upper and the lower electrodes 611, 609. Thus, a regular interlayer insulator 624 comprising silicon oxide or silicon nitride may be formed on the gate insulting layer 605 surrounding the capacitor structure 622. The hybrid film stack 510 formed as the capacitor layer 620 in the capacitor structure 622 may have a bottom surface in contact with the lower gate insulating layer 605 as needed. The interlayer insulator 624 may be in a single layer form, as depicted in FIG. 6B, or in multiple layer form as needed.

It is noted that the hybrid film stack 510 formed by the process 400 may be utilized to form the capacitor layer 620, gate insulating layer 605, as indicated in the circles of FIG. 6B, a passivation layer or any other suitable layers that require insulating materials in the TFT device structures 650 including LTPS TFT for LCD or OLED TFT as needed.

It is noted that the upper electrode 611 and the lower electrode 609 utilized to form the capacitor structures 622, 613 may also be pixel electrodes and/or common electrodes as needed.

Figure 7:
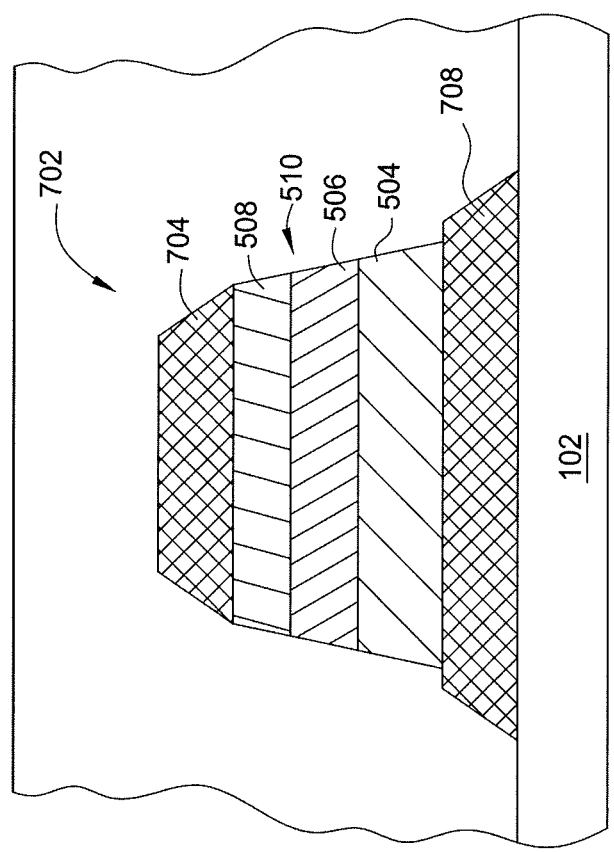
FIG. 7 is a sectional view of a capacitor structure formed in a display device structure having a hydride film stack with high capacitance of FIG. 4 formed therein.

FIG. 7 depicts a simple capacitor structure 702 (e.g., a MIM (metal-insulating-metal) structure) that may be formed on the substrate 102 utilized in display devices. Similar the upper electrode 611 and the lower electrode 609, (or a pixel electrode and a common electrode in a TFT device structure), the capacitor structure 702 includes a top electrode 704 and a bottom electrode 708 having the hybrid film stack 510 as a capacitor layer disposed in between to form the capacitor structure 702. The capacitor layer comprises a high-k material comprising $ZrO_2$ with or without aluminum dopants and an aluminum oxide layer as an interface layer. The hybrid film stack 510 serving as a capacitor layer in a capacitor structure may also in form of any numbers of the layers as needed.

Figure 8:
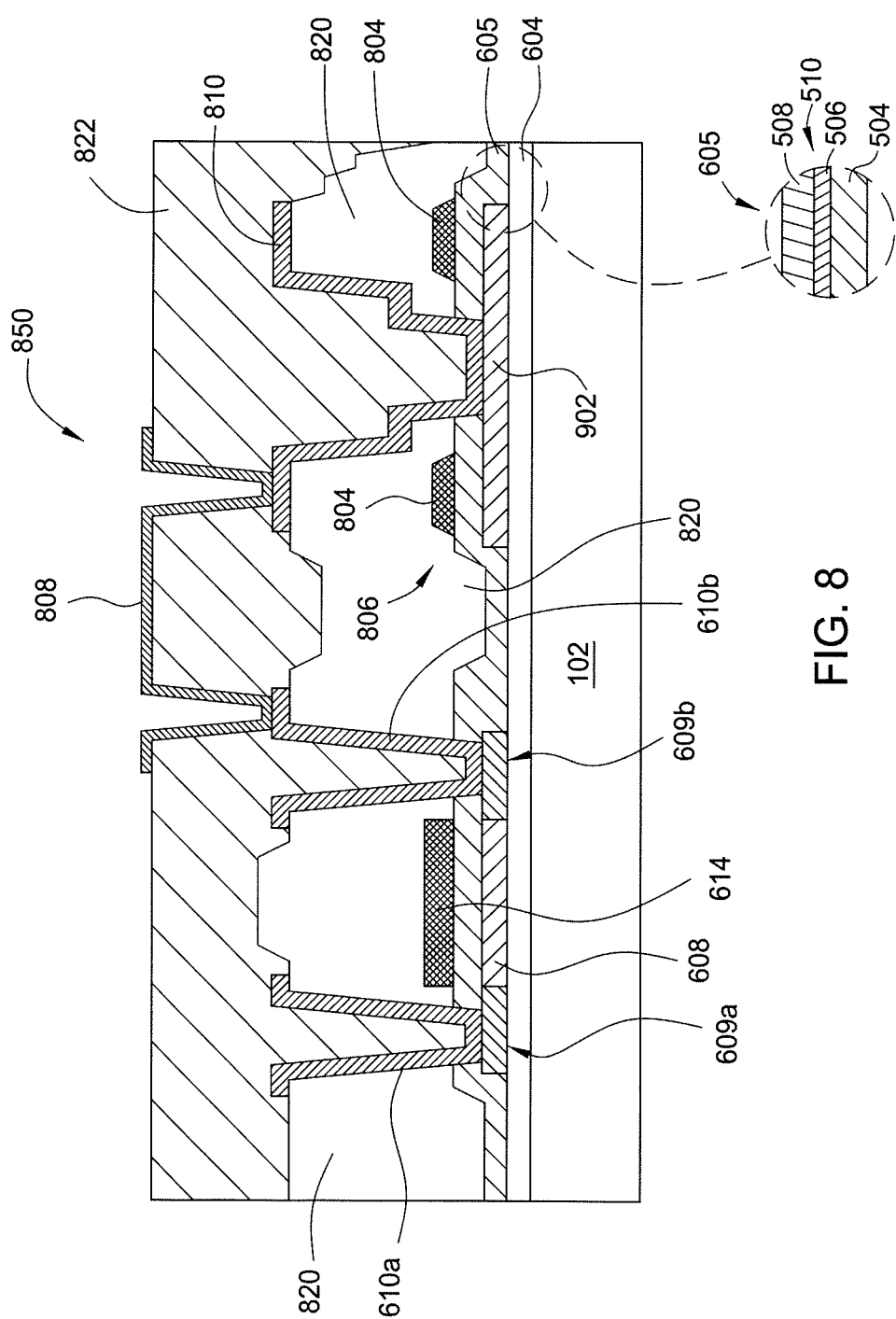
FIG. 8 is a sectional view of one example of a display device structure having a hydride film stack with high capacitance of FIG. 4 formed therein.

FIG. 8 depicts yet another example of a TFT device structure 850. Similar to the structure described above, the TFT device structure 850 includes a regular interlayer insulator 820 disposed on the gate electrode 614. A passivation layer 822 may be formed on the interlayer insulator 820. Another portion of the source and drain region 902 (electrically connected to the source and drain region 609a, 609b) is shown on the optional insulating layer 604. Another portion of the source-drain metal electrode layer 810 (electrically connected to the source-drain metal electrode layer 610a, 610b) is disposed on and electrically coupled to the source and drain region 902. A pixel electrode 808 may be electrically connected to the source-drain metal electrode layer 810, 610a, 610b. In this particular example, a portion of a gate insulating layer 605 passes through and between the gate electrode 614 and the channel region 608, extending to the area above the source and drain region 902. In one example, the gate insulating layer 605 may be the hybrid film stack 510 formed using the process 400 described above with referenced to FIG. 4. An additional electrode 804 is formed above the source and drain region 802 and the gate insulating layer 605, forming a capacitor structure 806 in the device structure 850. The additional electrode 804 formed on the gate insulating layer 605 (now also serves as a capacitor layer) may be electrically connected to the gate electrode 614. Thus, the additional electrode 804 and the source and drain region 902 along with the gate insulating layer 605 formed therebetween form the capacitor structure 806 in the device structure 850. Similarly, the gate insulating layer 605, now also serves as a capacitor layer, may be similar to the capacitor layer 612 described above and may be in form of any of the layers as needed.

It is noted that the source-drain metal electrode layer 610a, 610b, 810, the pixel electrode 808, the common electrode, the gate electrode 614, the upper electrode 611, the lower electrode 609, the top electrode 704, the bottom electrode 708, additional electrode 804 and any electrodes in the device structures may be any suitable metallic materials, including transparent conductive oxide layer (such as ITO or the like), silver nano ink, carbon nano tube (CNT), silver nano ink and CNT, graphene, aluminum (Al), tungsten (W), chromium (Cr), tantalum (Ta), molybdenum (Mo), copper (Cu), TiN, $MoO_2$, $MoN_x$, combination thereof or any suitable materials.

It is noted that the structures above the passivation layer 822 or the planarization layer 615 are eliminated for sake of brevity. However, in some exemplary device structures, an additional OLED or LCD devices, or other suitable devices may be formed above the passivation layer 822 or the planarization layer 615 to form other suitable flexible mobile display devices, such as LTPS OLED display devices with touch screen panels as needed.

Thus, the methods described herein advantageously improve the electron stability, electrical performance, low leakage and good film stack integration of display device structures by controlling the materials, particular a hybrid film stack having a high-k material comprising Zr containing layer formed on an interface layer comprising aluminum containing layer. The hybrid film stack may be fabricated either an ALD or PE-ALD and/or PECVD process, and structures of a gate insulating layer, capacitor layer, interlayer insulator, passivation layer, insulating materials in the display devices, along with a dielectric layer formed as a capacitor in the display devices with desired high electrical performance.

While the foregoing is directed to embodiments of the present disclosure, other and further embodiments of the disclosure may be devised without departing from the basic scope thereof, and the scope thereof is determined by the claims that follow.

What is claimed is:

1. A thin film transistor structure comprising:
   gate, source and drain electrodes formed in a thin film transistor on a transparent substrate;
   a silicon containing insulating layer formed in direct contact with the transparent substrate, the silicon containing insulating layer disposed below the gate, source and drain electrodes;
   an insulating layer formed in direct contact with the silicon containing insulating layer, wherein the insulating layer is disposed below the gate electrode; and
   a capacitor layer formed in direct contact with the gate electrode and the insulating layer, wherein the capacitor layer comprises a hybrid film stack having an interface layer disposed between a dielectric layer and a top layer, the dielectric layer comprising an amorphous aluminum doped zirconium containing material, wherein the dielectric layer has a thickness of 250 Å to 900 Å and a current leakage of less than 1E-8 A/cm$^2$, wherein the interface layer is at least one of aluminum oxide ($Al_2O_3$), aluminum nitride (AlN), aluminum titanium oxide (AlTiO), aluminum zirconium oxide (AlZrO), aluminum oxynitride (AlON), or yttrium oxide ($Y_2O_3$).

2. The structure of claim 1, wherein the dielectric layer comprises a dielectric constant greater than 15 and less than 25.

3. The structure of claim 1, wherein the top layer is disposed directly on the interface layer of the hybrid film stack, and the top layer comprises a silicon containing material.

4. The structure of claim 3, wherein the silicon containing material is silicon oxide or silicon nitride.

5. The structure of claim 1, wherein the dielectric layer is an aluminum doped $ZrO_2$ layer.

6. The structure of claim 1, where the amorphous aluminum doped zirconium containing material has an aluminum concentration between about 6 atm. % and about 20 atm. %.

7. The structure of claim 1, wherein the dielectric layer or the interface layer is formed by an ALD process or a PE-ALD process.

8. The structure of claim 1, wherein the insulating layer comprises the hybrid film stack.

9. A device structure utilized for display devices, comprising:
   a capacitor structure comprising a lower electrode, an upper electrode, and a hybrid film stack formed between the lower and the upper electrode, wherein the lower electrode is in direct contact with an insulating layer, the insulating layer in direct contact with a silicon-containing insulating layer, wherein the silicon-containing insulating layer is formed in direct contact with a transparent substrate, wherein the hybrid film stack comprises an interface layer disposed on and in direct contact with an aluminum doped Zr containing layer, the aluminum doped Zr containing layer having a dielectric constant between 15 and 25, wherein the aluminum doped Zr containing layer has a thickness of 250 Å to 900 Å and a current leakage of less than 1E-8 A/cm$^2$, wherein the interface layer is at least one of aluminum oxide ($Al_2O_3$), aluminum nitride (AlN), aluminum titanium oxide (AlTiO), aluminum zirconium oxide (AlZrO), aluminum oxynitride (AlON), or yttrium oxide ($Y_2O_3$); and
   wherein a silicon containing layer is disposed directly on the interface layer in the hybrid film stack.

10. The device structure of claim 9, wherein the insulating layer comprises the hybrid film stack, wherein the insulating layer is disposed below the two electrodes.

11. A device structure, comprising:
    a thin film transistor structure comprising source, drain, and gate electrodes formed over a silicon containing insulating layer; and
    a capacitor structure comprising top and bottom electrodes, and a hybrid film stack between the top and bottom electrodes, wherein the capacitor structure is formed over the silicon containing insulating layer, the silicon containing insulating layer is formed in direct contact with a substrate, wherein an insulating layer formed in direct contact with the silicon containing insulating layer, and below the gate electrode, and wherein a capacitor layer is formed directly on the gate electrode and the insulating layer, wherein the capacitor layer extends between top and bottom electrodes of the capacitor structure, wherein the capacitor layer comprises a hybrid film stack having an interface layer disposed between and in direct contact with a dielectric layer and a top layer comprising a silicon-containing material, the dielectric layer comprising an amorphous aluminum doped zirconium containing material, wherein the interface layer is at least one of aluminum oxide ($Al_2O_3$), aluminum nitride (AlN), aluminum titanium oxide (AlTiO), aluminum zirconium oxide (AlZrO), aluminum oxynitride (AlON), or yttrium oxide ($Y_2O_3$), wherein the dielectric layer has a thickness of 250 Å to 900 Å and a current leakage of less than 1E-8 A/cm$^2$.

* * * * *